United States Patent [19]
Ishikawa et al.

[11] Patent Number: 5,640,013
[45] Date of Patent: Jun. 17, 1997

[54] INFRARED SENSOR HAVING A HEAT SENSITIVE SEMICONDUCTOR PORTION THAT DETECTS AND ABSORBS INFRARED RAYS

[75] Inventors: Tomohiro Ishikawa; Masashi Ueno; Osamu Kaneda, all of Amagasaki, Japan

[73] Assignee: Mitsubishi Denki Kabushiki Kaisha, Tokyo, Japan

[21] Appl. No.: 543,040

[22] Filed: Oct. 13, 1995

[30] Foreign Application Priority Data

Apr. 7, 1995 [JP] Japan ............................ 7-082637

[51] Int. Cl.$^6$ ............................ H04N 5/33; G01J 5/20
[52] U.S. Cl. ................ 250/338.4; 250/332; 250/370.08
[58] Field of Search ............................ 250/338.4, 370.01, 250/370.14, 370.08, 332

[56] References Cited

U.S. PATENT DOCUMENTS

| | | | |
|---|---|---|---|
| 5,021,663 | 6/1991 | Hornbeck | 250/338.4 |
| 5,286,976 | 2/1994 | Cole | 250/338.4 |
| 5,369,280 | 11/1994 | Liddiard | 250/370.08 |
| 5,446,284 | 8/1995 | Butler et al. | 250/332 |

FOREIGN PATENT DOCUMENTS 5-206526  8/1993  Japan.

WO91/16607  10/1991  WIPO.

OTHER PUBLICATIONS

"An Inexpensive Difusion Barrier Technology for Polycide Gate Electrodes with an SiN Layer Formed with ECR Nitrogen Plasma", Tetsuo Hosoya et al., NTT LSI Laboratories, Extended Abstract of the 1994 International Conference on Solid State Devices and Materials, Yokohama, 1994, pp. 422–424. No Month.

Primary Examiner—Carolyn E. Fields

[57] ABSTRACT

An infrared sensor includes a substrate, an insulator layer formed on the substrate, and a heat-sensitive semiconductor layer having a temperature dependent electrical resistance with a relatively large temperature coefficient of resistance. In order to improve sensitivity of the heat-sensitive semiconductor layer for detecting infrared rays, high concentration impurity semiconductor regions are positioned on either side of the semiconductor layer to form a semiconductor section. The high concentration impurity semiconductor sections have a higher absorption coefficient of infrared rays than the semiconductor layer. Thus, the semiconductor section itself both detects and absorbs infrared rays with or without providing any heat-absorbing layer. Further, electrodes are connected to each high-concentration impurity layer, which form an ohmic contact therewith.

16 Claims, 12 Drawing Sheets

INFRARED SENSOR HAVING A HEAT SENSITIVE SEMICONDUCTOR PORTION THAT DETECTS AND ABSORBS INFRARED RAYS

BACKGROUND OF THE INVENTION

1. Field of the Invention

The present invention relates to an infrared sensor of bolometer type and a manufacturing method therefor.

2. Description of the Prior Art

An infrared sensor of bolometer type has detects infrared rays via a heat-sensitive layer which changes resistance according to temperature made of a metallic film and a ceramic such as vanadium oxide, or polycrystalline or amorphous silicon. When infrared rays irradiate the infrared sensor, the resistance of the heat-sensitive layer changes according to heat transferred from the adjacent absorption layer or the like. The change in resistance is detected as a change in voltage or current applied to the heat-sensitive layer, so as to detect irradiation of infrared rays.

The performance of bolometer type infrared sensor depends on the smallness of noise equivalent temperature difference (NETD). The NETD of the sensor is expressed as follows:

$$NETD \propto G(1+\omega^2\tau^2)^{1/2}/(I_b \alpha R_e \eta), \quad (1)$$

where $I_b$ denotes bias current through the heat-sensitive resistor layer, $R_e$ denotes resistance, $\alpha$ denotes temperature coefficient of resistance (TCR), $\eta$ denotes a ratio of absorption of infrared rays of the infrared sensor, G denotes thermal conductivity between the sensor and the substrate, $\omega$ denotes angular frequency of infrared rays, and $\tau$ denotes thermal response time.

A bolometer type infrared sensor satisfies following requirements: (1) The temperature coefficient of resistance (TCR) as detection sensitivity of infrared rays is large. (2) The thermal conductivity is low. (3) The thermal capacitance is small. (4) The ratio of absorption of infrared rays is large. That is, absorption and detection sensitivity of infrared rays are both large.

If polycrystalline or amorphous silicon is used as a heat-sensitive resistor layer, the sensitivity can be increased by implanting impurities of boron, phosphor, arsenic or the like to realize a resistivity and a high temperature coefficient of resistance (TCR) as desired. With respect to this point, a technique on controlling impurities in order to control the temperature coefficient of resistance is described for bolometers using polycrystalline or amorphous silicon as a heat-sensitive resistor, for example, in U.S. Pat. No. 5,021,663 and international application WO91/16607.

However, in the prior art infrared sensors comprising polycrystalline or amorphous silicon, if an amount to be added to realize a desired temperature coefficient of resistance is very small, an amount of infrared rays absorbed by the polycrystalline or amorphous silicon itself is very small.

Therefore, in order to enhance absorption of infrared rays, various structures of infrared sensor of bolometer type are proposed. For example, an infrared detector including a heat-sensitive semiconductor or resistor layer is formed above a cavity. A surface of the detector is almost covered with electrodes made of electrically conducting films for reading external signals. A heat due to absorption of infrared-rays in the electrodes is transferred to the detector to increase detection sensitivity of infrared rays.

In another modified structure, a heat absorption layer made of a metallic thin film is provided just above the infrared detector. Then, the heat absorbed by the layer is transferred to the infrared detected to improve detection sensitivity.

In a different modified structure, electrical leads for externally transmitting signals from the electrodes includes a metallic material such as TiN, and the leads also serve as a heat absorption layer. Then, it is a problem that an additional structure is needed which absorbs infrared rays by using a film other than the heat-sensitive semiconductor or the like to transfer the heat to the heat-sensitive semiconductor or the like, to detect the infrared rays efficiently.

Further, it is a problem that the resistance of the sensor depends of the state at the interface of the polycrystalline or amorphous silicon with the electrode and the kinds of the metal, its compound and the like. Especially, if the impurity concentration in the polycrystalline or amorphous silicon is low, it is difficult to get a reliable ohmic contact.

Further, if an infrared sensor has a smaller size, the sensors can be mounted at a high density. However, there is a problem that a decrease in an area for receiving infrared rays lowers the sensitivity.

An infrared image sensor includes a matrix array of the above-mentioned infrared sensors and selection circuits for determining scanning lines along vertical and horizontal directions. The scanning lines are connected to the sensors along rows and columns of the matrix array, and a switching element such as a field effect transistor is provided at each intersection of the scanning lines or for each sensor. Thus, it is a problem that a structure becomes complicated and that the selection circuits and the like occupy a large area so that mounting of the sensors at a high density becomes difficult.

Further, when a silicon integrated circuit and the infrared sensor are formed in the same production line, high temperature on forming the integrated circuit makes impurities diffuse from the high concentration impurity layers to an infrared detection section to deteriorate the detection sensitivity.

Further, in a prior art manufacturing method of infrared sensor, a material such as vanadium oxide or the like is used as a heat-sensitive resistor layer. Therefore, it is a problem that if a manufacturing apparatus for silicon semiconductor integrated circuit is used, the apparatus becomes dirty. Therefore, the sensor cannot be manufactured by using the same apparatus as the semiconductor integrated circuit. Thus, it is a problem that a yield of the infrared image sensor is worse so that it is expensive.

When a small infrared sensor is formed, it is a problem that scattering between lots arises due to a shift of the mask used in photolithography processes.

SUMMARY OF THE INVENTION

A first object of the invention is to provide an infrared sensor which has improved detection sensitivity and absorption sensitivity of infrared rays and perform both absorption and detection of infrared rays by a heat-sensitive semiconductor layer itself.

Another object of the invention is to provide an infrared sensor having a structure which can be driven at a low voltage even if the sensor has a high resistivity.

Still another object of the invention is to provide an infrared sensor which does not deteriorate performance after high temperature manufacturing processes of an integrated circuit formed at the same time as the sensor.

A further object of the invention is to provide an infrared image sensor which can select a sensor in an infrared image sensor by using a simple structure.

A still further object of the invention is to provide an infrared sensor which has small scattering of performance between lots.

A further object of the invention is to provide a manufacturing method of an infrared sensor having a high precision of mask alignment in photolithography processes.

In one aspect of the invention, an infrared sensor device includes a heat-sensitive semiconductor layer formed on an insulator layer formed on a substrate, high concentration impurity layers interposing the semiconductor layer, and electrodes connected to the high-concentration impurity layers. The semiconductor layer has an electrical resistance depending on temperature with a relatively large temperature coefficient of resistance. Therefore, the detection sensitivity of infrared rays of the semiconductor layer itself is enhanced. Because efficiency of absorption of infrared rays of the high concentration impurity layer is large, an amount of absorption of infrared rays is enhanced. Further, because the connection to the electrodes has ohmic contact, scattering of signals is reduced. Thus, the detection sensitivity is enhanced so that the heat-sensitive semiconductor layer itself can detect infrared rays.

In a second aspect of the invention, an infrared sensor device includes an insulator layer formed on a substrate, a first electrode formed on the insulator layer, a heat-sensitive semiconductor layer formed on the first electrode, and a second electrode formed on the second high-concentration impurity layer. The heat-sensitive semiconductor layer includes a first high concentration impurity layer formed on the first electrode, a semiconductor layer formed on the first high concentration impurity layer and having electrical resistance depending on temperature with a relatively large temperature coefficient of resistance, and a second high concentration impurity layer formed on the semiconductor layer. The first and second high concentration impurity layers are formed on entire top and bottom surfaces of the semiconductor layer. Because the semiconductor layer has an electrical resistance depending on temperature with a relatively large temperature coefficient of resistance, the detection sensitivity of infrared rays of the semiconductor layer itself is enhanced. An amount of absorption of infrared rays is enhanced by the high concentration impurity layers. Because the areas of the high concentration impurity layers are wide, an amount of absorbing infrared rays becomes larger. Further, because the connection to the electrodes has ohmic contact, scattering of signals is reduced. Thus, the sensitivity is enhanced so that the heat-sensitive semiconductor layer itself can detect infrared rays.

Preferably, a diffusion prevention layer is provided between the semiconductor layer and one of the high concentration impurity layers. Then, the diffusion of impurities from the high concentration impurity layers to the heat-sensitive semiconductor layer is prevented in high temperature processes.

Preferably, the semiconductor layer between the first and second high concentration impurity layers extends in planes in parallel to a plane of the substrate. Then, the detection sensitivity of infrared rays of the semiconductor layer itself is enhanced without providing a heat absorption layer. Further, the precision of photolithography processes to determine the width of the semiconductor layer is enhanced.

Preferably, the heat-sensitive semiconductor layer comprises a diode. Then, in an infrared rays image sensor comprising a matrix array of the infrared-rays sensors, a current path except the desired sensor can be blocked.

In a third aspect of the invention, a manufacturing method of an infrared sensor device includes the steps of: (a) forming an insulator layer on a semiconductor layer; (b) forming a first resist mask on the insulator layer and removing a part of the insulator layer by using the first resist mask as a mask; (b) implanting impurities onto the semiconductor layer to form a first high concentration impurity layer; (c) removing the first resist mask and forming a second resist mask by using the insulator layer as a reference position; and (d) implanting impurities to form a second high concentration impurity layer. Therefore, an edge portion of the insulator layer formed with the first resist mask is used as a reference mark for alignment of the second resist mask.

An advantage of the invention is that the detection sensitivity is enhanced so that the heat-sensitive semiconductor layer itself can detect infrared rays.

An advantage of the invention is that an edge portion of the insulator layer formed with the first resist mask is used as a reference mark for alignment of the second resist mask.

BRIEF DESCRIPTION OF THE DRAWINGS

These and other objects and features of the present invention will become clear from the following description taken in conjunction with the preferred embodiments thereof with reference to the accompanying drawings, and in which.

DETAILED DESCRIPTION OF THE PREFERRED EMBODIMENTS

Figure 1A:
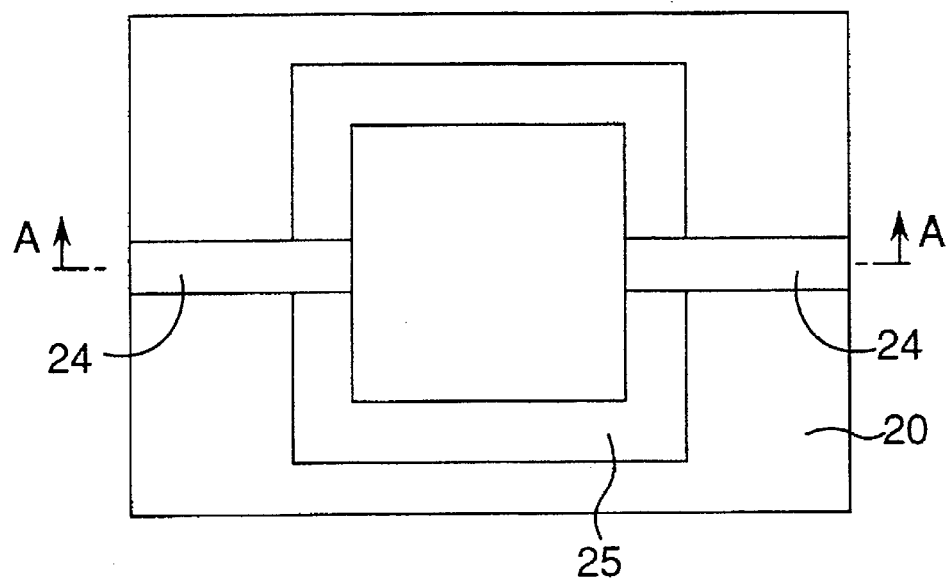
FIG. 1A is a plan view of an infrared sensor of a first embodiment of the present invention.

Referring now to the drawings, wherein like reference characters designate like or corresponding parts throughout the views, embodiments of the invention are explained below.

EMBODIMENT 1

Figure 1B:
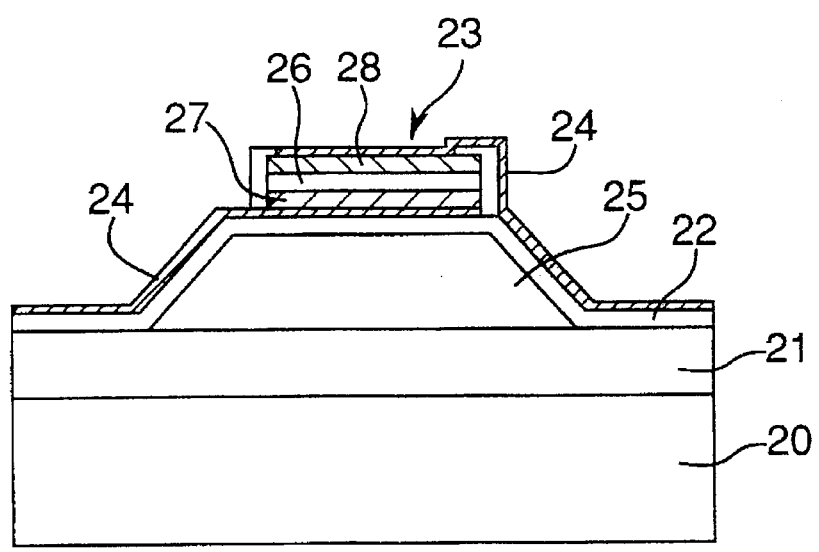
FIG. 1B is a sectional view along line A—A in FIG. 1A.

FIG. 1A shows a plan view of an infrared sensor of a first embodiment of the present invention, and FIG. 1B shows a sectional view along line A—A in FIG. 1A. A first insulator layer 21 is formed on a silicon substrate 20. A second insulator layer 22 is formed on a cavity 25 explained later and on the first insulator layer 21. The second insulator layer 22 has a large absorption coefficient at infrared wavelength region.

Then, a heat-sensitive semiconductor layer 23 is formed on the second insulator layer 22, and it is a variable resistance layer which changes resistance with increase in temperature due to absorption of infrared rays. The heat-sensitive semiconductor layer 23 includes a semiconductor layer 26 and high concentration impurity layers 27, 28 interposing the semiconductor layer 26 at the top and bottom plane thereof. The semiconductor layer 26 has a relatively large temperature coefficient of resistance as a detection sensitivity of infrared rays, while the high concentration impurity layers 27, 28 have a high absorption amount of infrared rays. The semiconductor layer 26 is for example a polycrystalline silicon or amorphous silicon layer with or without implanted impurities to have a desired resistivity of for example $10^4 10^{-2}$ Ω·m and a desired temperature coefficient of resistance (TCR). A detection area of the layer 23 is for example 30 μm *30 μm and a thickness thereof is about 2,000Å.

The cavity 25 is formed between the insulator layers 21 and 22 below the heat-sensitive semiconductor layer 23 in order to prevent to transfer of heat in the layer 23 to adjacent areas. The second insulator film 22 has a flat portion in parallel to a plane of the substrate 20, and a bridge portion connecting the flat portion to a base portion applied to the first insulator layer 20. The heat-sensitive semiconductor layer 23 is formed above the flat portion of the second insulator layer 22.

Two wide electrodes 24 connecting to an external signal processing circuit are connected so as to interpose the thin heat-sensitive semiconductor layer 23 above and below. A first electrode of the electrodes 24 is formed on the flat portion of the second insulator layer 22, extending along a direction to the base portion thereof, and the heat-sensitive semiconductor layer 23 is formed on the electrode 24. A second of the electrodes 24 is formed on the top of the heat-sensitive semiconductor layer 23, extending along direction to the base portion opposite to the first electrode. Because the wide electrodes 24 are applied to the top and bottom of the heat-sensitive semiconductor layer, even if the resistivity of the heat-sensitive semiconductor layer 23 is large, the resistance between the electrodes 24 can be decreased, so that a low applied voltage appropriate to the signal processing circuit is used for driving the sensor.

Figure 2A:
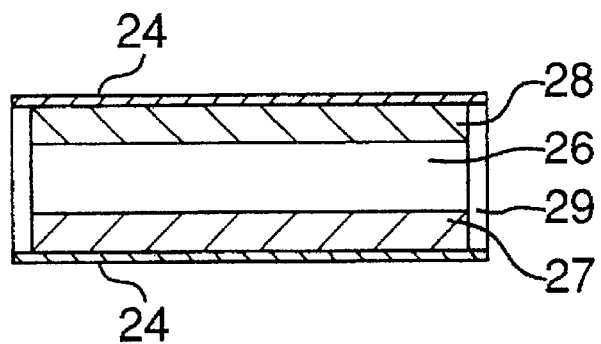
FIGS. 2A, 2B and 2C are sectional views of an enlarged view of a part of various heat-sensitive resistor layers.
Figure 2B:
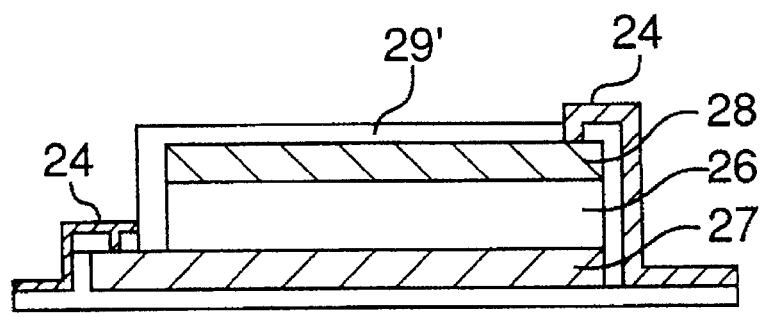
Figure 2C:
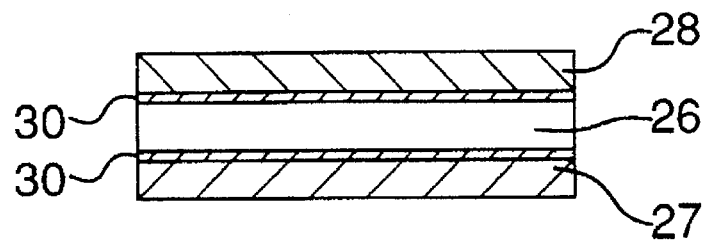

FIGS. 2A–2C show various types of the heat-sensitive semiconductor layer 23 shown in FIGS. 1A and 1B. The heat-sensitive semiconductor layer 23 shown in FIG. 2A is similar to the counterpart shown in FIGS. 1A and 1B. The electrodes 24 are formed at the top and bottom plane of the high concentration impurity layers 27, 28, while a protection layer 29 is formed at the sides of the semiconductor layer 26 and the high concentration impurity layers 27, 28.

In the structure shown in FIG. 2B, an electrode 24 is formed at an end of a top plane of the lower high concentration impurity layer 27, and another electrode 24 is formed at one end of a top plane of the other high concentration impurity layer 28. Further, a protection layer 29 as an insulator layer provided for protection is applied to the sides of the semiconductor layer 26 and the high concentration impurity layers 27, 28 except the electrodes 24. This structure shows an example which can reduce production steps of the electrodes 24, as will be explained later.

FIG. 2C shows a structure where two diffusion prevention layers or barrier layers 30 are formed between the semiconductor layer 26 and the high concentration impurity layer 27, 28. The diffusion prevention layer 30 prevents diffusion of phosphor or the like from the high concentration impurity layers 27, 28 into the semiconductor layer 26 as a low concentration layer, in high temperature processes included in manufacturing steps of an integrated circuit or the like to be formed at the same time as the infrared sensor. The barrier layers 30 may also be made of silicon nitride or silicon dioxide.

Figure 3A:
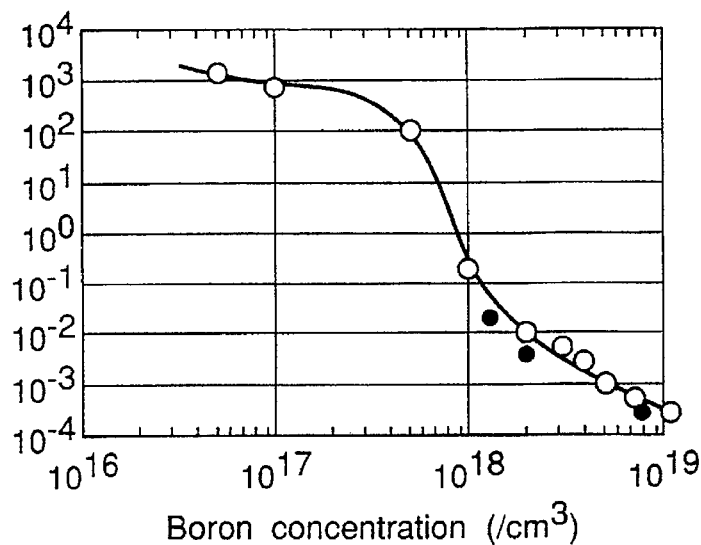
FIGS. 3A and 3B are graphs of resistivity of polysilicon and temperature coefficient of resistance (TCR) plotted against implantation amount, wherein open circles denote data described in literature and solid circles denote experimental values by the inventors.
Figure 3B:
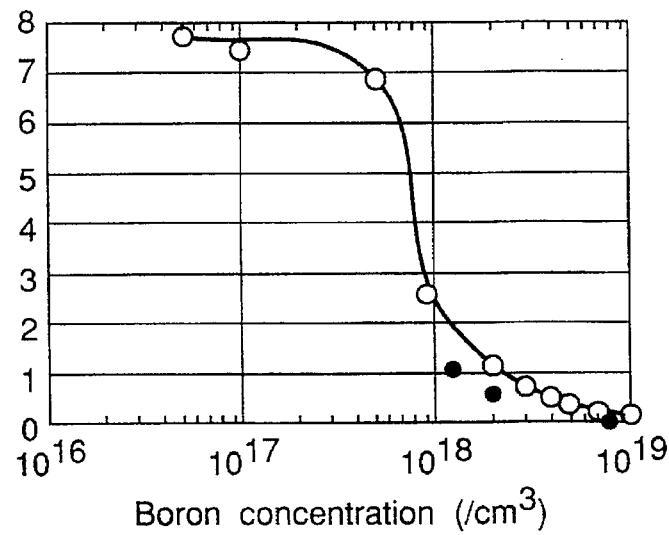

An implantation amount of impurities into the semiconductor layer 26 shown in FIGS. 1A–1B and 2A–2C is determined as follows: FIG. 3A shows a graph of an example of resistivity of polycrystalline silicon into a polycrystalline silicon, while FIG. 3B shows a graph of an example of temperature coefficient of resistance (TCR), both plotted against implantation amount of boron. The temperature coefficient of resistance (TCR) of the semiconductor layer 26 is increased in order to improve detection sensitivity of the infrared sensor. Then, for example, an amount of about $10^{17}$–$10^{18}$/cm$^3$ of boron is implanted to have a high temperature coefficient of resistance, according to FIGS. 3A and 3B. For example, for the semiconductor layer 26, boron of $2.2*10^{13}$/cm$^2$ is implanted into polycrystalline silicon of thickness of 200 nm, or boron of $1.1*10^{18}$/cm$^3$ is implanted to obtain a resistivity of 110 mΩ.m and temperature coefficient of resistance of 2.0%/K.

Figure 3C:
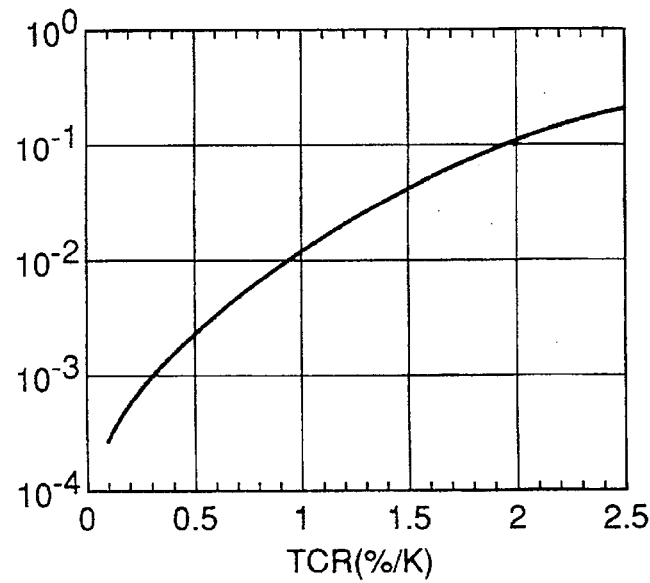
FIG. 3C is a graph of resistivity plotted against TCR.

FIG. 3C shows resistivity plotted against temperature coefficient of resistance (TCR). If the temperature coefficient of resistance (TCR) is increased, the resistivity of the semiconductor layer 26 increases. Therefore, the implantation amount of impurities has to be determined to maximize the temperature coefficient of resistance (TCR) as far as the resistivity does not exceed a value which can drive the above-mentioned structures of the heat-sensitive semiconductor layer 23 of the infrared rays sensor, by referring FIGS. 3A and 3B. For example, according to FIGS. 3A–3C, the implantation amount of boron into the polycrystalline silicon layer can be selected to be about $10^{17}$–$10^{18/cm3}$.

The kind of implanted impurity ions is not limited to boron, but phosphor, arsenic and the like can also realize similar characteristics.

On the other hand, the high concentration impurity layers 28 and 29 can absorb infrared rays due to absorption by free electrons, and the absorbed amount increases with increase in implantation amount. Thus, they are used as layers for absorbing infrared rays. If they are made from polycrystalline silicon, the absorption amount of infrared rays increases with implantation amount of boron of $10^{18}$/cm$^3$ or more. However, if implantation amount of boron increases to $10^{20}$/cm$^3$ or more, reflection from the surface increases. Therefore, this amount is disadvantageous from viewpoint of absorption of infrared rays. Then, implantation amount is set to be about $10^{18}$–$10^{20}$/cm$^3$.

As shown in FIG. 3A, if the amount of ion implantation into the high concentration impurity layers 27 and 28 is set to be $10^{18}$/cm$^3$ or more, the resistivity can be decreased to $10^{-2}$ Ω·m or less, and the contact with the electrode 24 is ohmic. Therefore, there is no attenuation of signals at the connection part with the electrode, or the detected signal can be taken out efficiently.

Figure 4A:
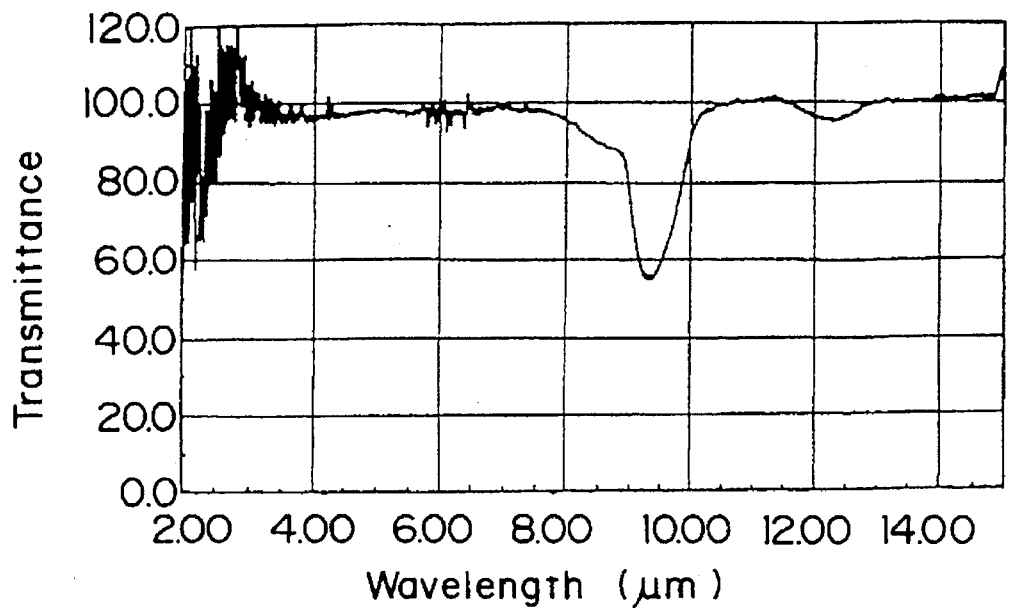
FIGS. 4A and 4B are graphs of wavelength dependence of optical transmittance of an insulator layer of $SiO_2$ and of SiN, respectively.
Figure 4B:
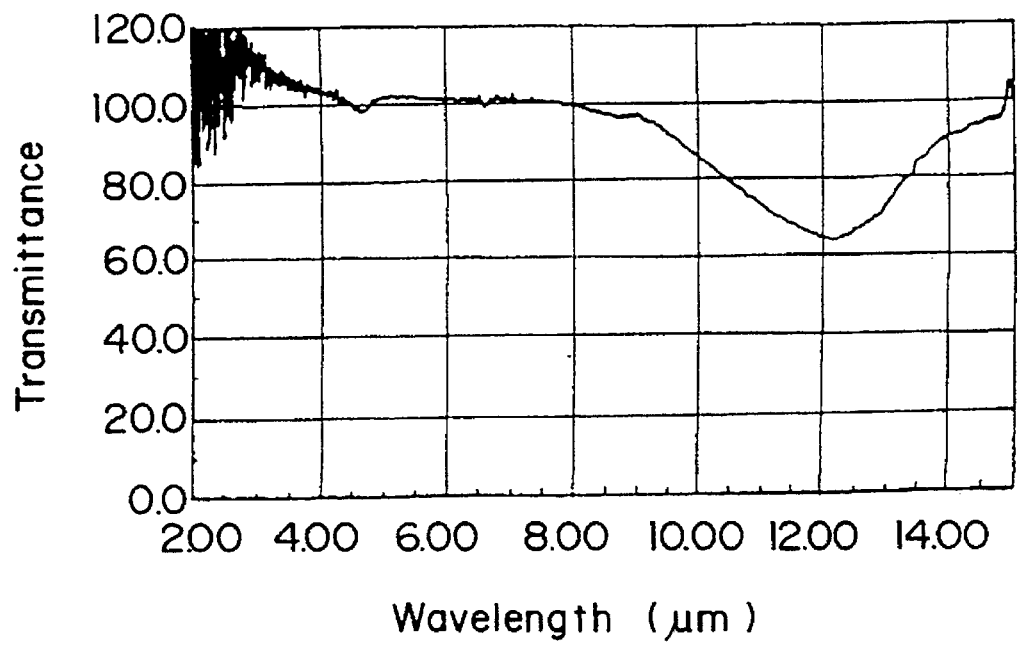

Further, in the infrared sensor, the insulator layer 22 is made of a material having a large absorption coefficient for a light in infrared ray region in order to improve detection sensitivity of infrared rays by transmitting the absorbed infrared rays to the heat-sensitive semiconductor 26. For example, it is observed that, as shown in FIG. 4A, silicon monoxide has an absorption coefficient of about 40% at wavelength of 9.5 μm, while as shown in FIG. 4B, silicon nitride has an absorption coefficient of about 30% at wavelength of 12 μm.

Next, operation of the above-mentioned infrared sensor is explained. If infrared rays in a wavelength range of 7–12 μm irradiates the heat-sensitive semiconductor layer 23 made of polycrystalline or amorphous silicon, the layer 23 absorbs infrared rays so that the temperature thereof increases to change resistance thereof. The resistance change can be taken out as a change in voltage or current applied to the electrodes 24 at the two ends of the heat-sensitive semiconductor layer 23.

In the structure of the infrared sensor device, the first and second high concentration impurity layers 27 and 28 are formed on the entire surfaces above and below the semiconductor layer 26, and the wide electrodes 24 are formed above the semiconductor layer 26. Therefore, a current flows vertically through the thickness of the heat-sensitive resistor layer 23. In general, resistance R of a resistor layer is expressed as $$R = \rho \cdot l/S,$$

where ρ denotes resistivity of a material of the resistor layer, l denotes a length thereof, and S denotes a sectional area of the resistor layer. Therefore, the resistance of the infrared sensor can be decreased by decreasing the thickness of the semiconductor layer 26 as a distance between the high concentration impurity layers 27 and 28 and by increasing the area of the layers 27 and 28, even if the resistivity of the heat-sensitive semiconductor layer 23 is high. Then, the infrared sensor can be driven with a low voltage appropriate to a signal processing circuit.

In the infrared sensor, a sensor having a large temperature coefficient of resistance (TCR) as detection sensitivity of infrared rays can be realized by using the semiconductor layer 26 made of polycrystalline or amorphous silicon with or without boron, phosphor or arsenic of an appropriate amount at low concentration. Thus, an infrared sensor of bolometer type having a high detection sensitivity of infrared rays can be provided. Further, as explained above, the high concentration impurity layers 27 and 28 are used as layers for absorbing infrared rays. Further, the connection thereof with the electrodes 24 is ohmic. Thus, by enhancing absorption and detection sensitivity of infrared rays by the heat-sensitive semiconductor layer 23 itself, infrared rays can be detected only by the heat-sensitive semiconductor layer 23.

Further, because the insulator layer 22 having a large absorption coefficient of light in infrared ray region in the infrared sensor, the layer 22 acts as an insulator layer by selecting an appropriate insulator material according to wavelength of infrared rays to be used, while infrared rays are absorbed with the semiconductor layer 26 to conduct heat to the semiconductor layer 26 to enhance the sensitivity of the infrared sensor.

Still further, by providing the cavity 25 between the heat-sensitive semiconductor layer 23 and the substrate 20 in the infrared sensor of the first embodiment, the heat-sensitive semiconductor layer 23 is supported only by bridges comprising the electrode 24 and the insulator layer 22 below the electrode 24. Therefore, heat generated in the heat-sensitive semiconductor layer 23 is separated thermally from the substrate 20 or the external, so that a quantity of received infrared rays can be detected effectively.

EMBODIMENT 2

Figure 5A:
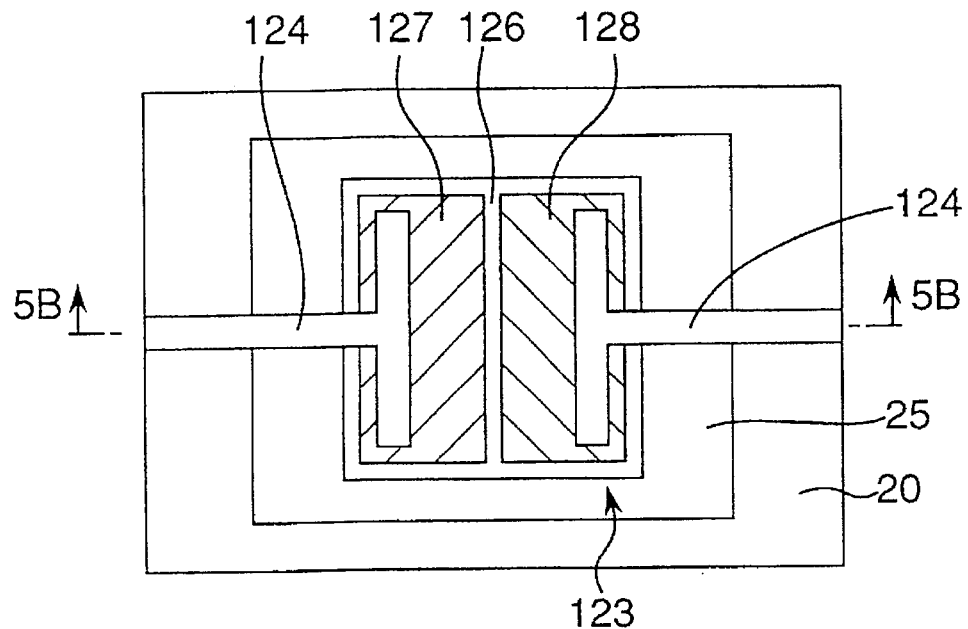
FIG. 5A is a plan view of an infrared sensor of a second embodiment of the present invention.
Figure 5B:
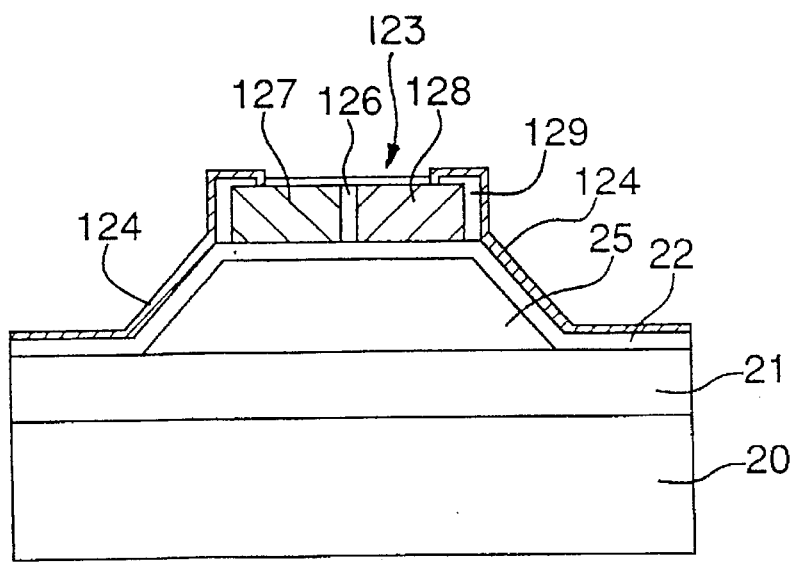
FIG. 5B is a sectional view along line A—A in FIG. 5A.

FIG. 5A is a plan view of another embodiment of an infrared sensor of the invention, and FIG. 5B is a sectional view along line A—A in FIG. 5A. The infrared sensor has a different type of the heat-sensitive semiconductor layer. Similar to the structure shown in FIGS. 1A and 1B, a first insulator layer 21 is formed on a silicon substrate 20, and a second insulator layer 22 is formed on a cavity 25 and on the first insulator layer 21. The second insulator layer 22 has a large absorption coefficient at infrared wavelength region. Then, a heat-sensitive semiconductor layer 123 is formed on the insulator layer 22. The heat-sensitive semiconductor layer 123 is a variable resistance layer which changes resistance with increase in temperature due to absorption of infrared rays, and includes a narrow semiconductor region 126 made of a polycrystalline or amorphous silicon region with or without impurities of a low concentration and two high concentration impurity regions 127 and 128 interposing the semiconductor region 126 at both sides thereof. The semiconductor region 126 and the high concentration impurity regions 127 and 128 are formed on a flat portion of the insulator layer 22 above the cavity 25 in parallel to a plane of the substrate 20. Two electrodes 124 are connected to the high concentration impurity regions 127 and 128 and extend along opposite directions to a base portion of the insulator layer 22. Further, a protection layer 129 is formed at sides of the heat-sensitive semiconductor layer 123 for protecting it.

Similarly to the heat-sensitive semiconductor layer 23 of the first embodiment, the semiconductor region 126 has a relatively large temperature coefficient of resistance as a detection sensitivity of infrared rays, while the high concentration impurity regions 127, 128 has a high absorption amount of infrared rays. The semiconductor region 126 is for example a polycrystalline silicon or amorphous silicon region with or without implanted impurities to have a desired resistivity of for example $10^4$–$10^{-2}$ Ω·m and a desired temperature coefficient of resistance (TCR).

The size of the heat-sensitive semiconductor layer 123 is for example 30 μm* 30 μm, wherein the semiconductor region 126 occupies an area of 2 μm*30 μm and the high concentration impurity regions 127 and 128 are located at both sides of the semiconductor region 126.

Infrared rays are absorbed at the wide area of the high concentration impurity regions 127 and 128, and they are detected by the semiconductor region 126.

The sensor having this structure has a higher resistance than that of the first embodiment if a material of the same resistivity is used, and this requires a higher applied voltage.

However, in an infrared-image sensor having a matrix array of the sensors, scattering of performances between many sensors is a problem. The scattering is controlled by a width of the semiconductor region 126 in a production process. In the second embodiment where a path of signal current is parallel to the substrate, an alignment of a mask with a high precision is possible to form a correct width of the semiconductor region 126, as explained later. Therefore, it is an advantage of the sensor of the second embodiment that a reliable image sensor for infrared rays can be provided.

Figure 6A:
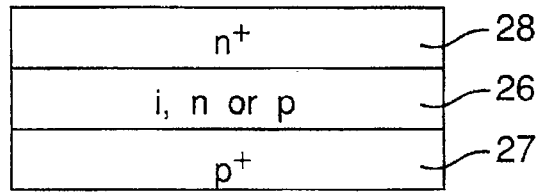
FIG. 6A is a plan view of an infrared sensor.
Figure 6B:
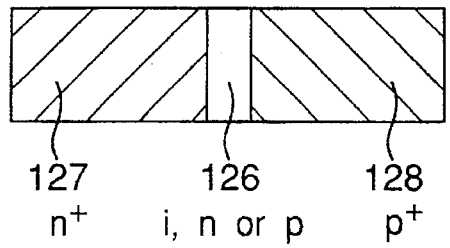
FIG. 6B is a sectional view along line A—A in FIG. 6A.

As shown in FIGS. 6A and 6B, the high concentration impurity layers 27 and 28, 127 and 128 formed at both sides of the semiconductor layer 26, 126 in the first and second embodiments can be made of conduction types of n+ and n− different from each other. In other words, a diode can be constructed by a combination of the semiconductor layer 26, 126 and the high concentration impurity layers 27, 28 and 127, 128. The semiconductor layer 26 may be i, n or p conduction type. It is to be noted that active elements such as field effect transistors are not used in contrast to the prior art image sensor.

Figure 7A:
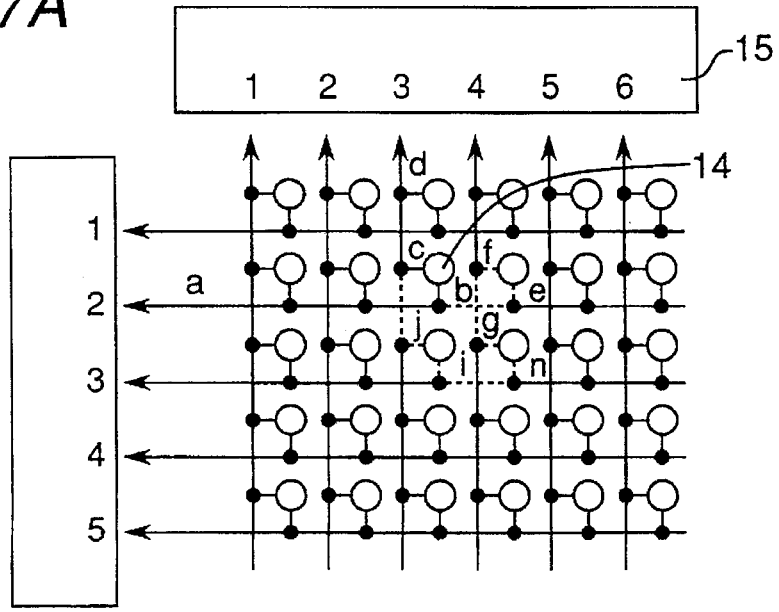
FIG. 7A is a diagram of an infrared image sensor including infrared sensors.

FIG. 7A shows an infrared image sensor including infrared sensors arranged as a matrix array of the above-mentioned infrared sensors 14. The image sensor further comprises a circuit 15 for selecting a sensor along the vertical direction, a circuit 16 for selecting a sensor along the horizontal direction, and scanning lines connected to the circuits 15, 16.

Figure 7B:
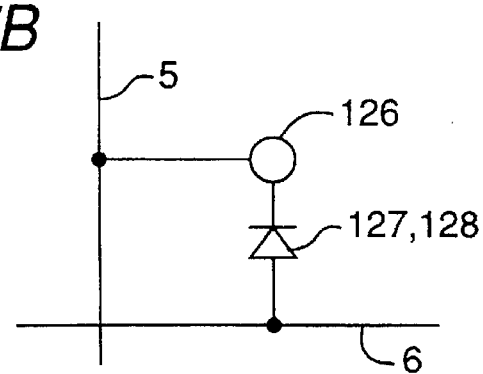
FIG. 7B is a diagram of a pixel or sensor in the image sensor.

As shown in FIG. 7B, the scanning lines 5, 6 are connected through the electrodes 24, 124 to the sensors arranged along rows and columns of the matrix array without using switching elements such as field effect transistors in contrast to the prior art image sensor. FIG. 7B shows one pixel or a sensor shown in FIG. 6A and 6B in the matrix array. That is, the semiconductor region 126 and the high concentration impurity regions 127, 128 having different conduction types form a diode.

A pixel or sensor in the matrix array is selected as follows: For example, if a voltage is applied to the third terminal of the circuit 15 for selecting a sensor along vertical direction and to the second terminal of the circuit 16 for selecting a sensor along horizontal direction, the electric current flows through a path of "abcd", to select the sensor 14. Even though no switching elements are used, along paths such as "abefghijcd" shown in FIG. 7A, roundabout currents such as "ji" and "fe" do not flow, and a desired sensor can be selected without using switching elements. Therefore, a large area for switching elements is not needed, and the sensors can be arrayed at a high density. As explained above, because the heat-sensitive semiconductor layer has a function of a diode, a structure of a circuit for selecting a sensor become simpler, and the sensors of a higher density can be mounted in the image sensor.

A diode can be formed by using a combination of semiconductor regions of various conduction types, and following modifications are possible: It can be selected according to a polarity of scanning circuit and the amplitude of rated voltage.

In a diode structure, the heat-sensitive semiconductor layer 123 comprises a p-type high concentration impurity region 127, a semiconductor region 126 made of a polycrystalline or amorphous silicon region of an n-type low concentration impurity region or of a region with no implanted impurities, and an n-type high concentration impurity region 128.

In another diode structure, the heat-sensitive semiconductor region 123 comprises a p-type high concentration impurity region 127, a semiconductor region 126 made of a polycrystalline or amorphous silicon region of a p-type low concentration impurity region or of a region with no implanted impurities, and an n-type high concentration impurity region 128.

Figure 8:
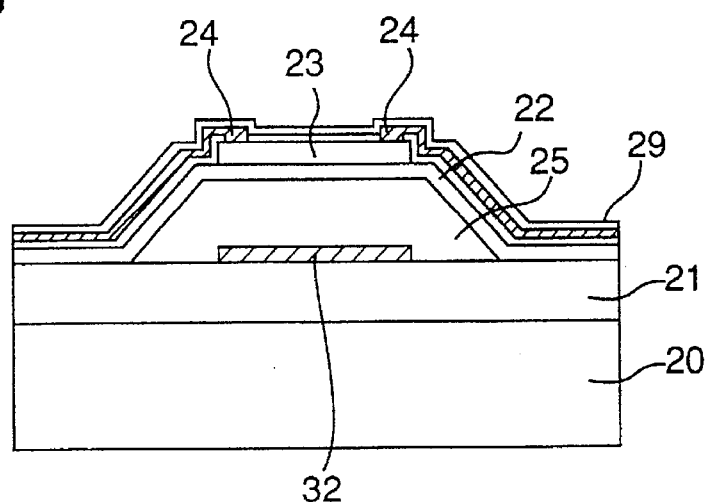
FIG. 8 is a diagram of a structure of an infrared sensor device of the invention.

FIG. 8 is an infrared sensor wherein a reflection film 32 is provided at the bottom of the cavity 25 on the first insulator layer 21 in the infrared sensor of the first and second embodiments in order to improve absorption of the polycrystalline or amorphous silicon layer as a material for absorbing infrared rays. The reflection film 32 is made of a material having a high reflectance such as aluminum, tungsten, tungsten silicide, titanium silicide, platinum silicide or the like. The reflection film 32 is used to collect reflected light of infrared rays in order to use received light efficiently. Then, the received infrared rays can be detected more efficiently. 10 If the distance between the heat-sensitive semiconductor layer 23 and the bottom of the substrate 20 is adjusted to be λ/4 as an optical resonance structure, the light can be collected more efficiently. The distance can be adjusted by controlling a thickness of a sacrificing layer 35 explained later when the cavity 25 is formed. The distance is 2.5 µm in a space of index of refraction of one for a wavelength to be detected of about 10 µm. However, as far as an advantage of collecting light is observed, the distance is not needed to be 2.5 µm.

EMBODIMENT 3

FIGS. 9A–9I show manufacturing steps of the infrared sensor of the first embodiment of the invention.

Figure 9A:
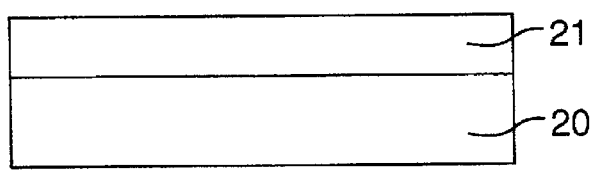
FIGS. 9A–9I are sectional views for illustrating manufacturing steps of the first embodiment of an infrared sensor of the invention.

First, as shown in FIG. 9A, an insulator film 21 made of silicon dioxide or silicon nitride is formed on a silicon substrate 20 with a chemical vapor deposition (CVD) process or the like.

Figure 9B:
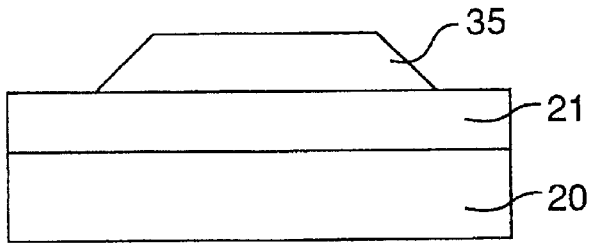

Next, as shown in FIG. 9B, a layer of polycrystalline or amorphous silicon is formed with CVD under reduced pressure, plasma CVD, sputtering or the like, and the payer is patterned to form a layer of a sacrificing layer 35.

Figure 9C:
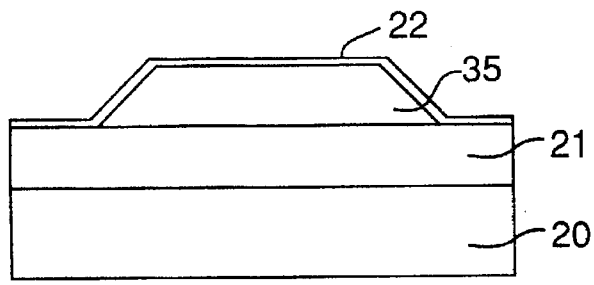

Next, as shown in FIG. 9C, an insulator layer 22 made of silicon dioxide or silicon nitride is formed on the sacrificing layer 35 with CVD.

Such a material for the layer is made as thin films in order to assure good temperature increase of the infrared sensor. However, the film thickness is set by taking mechanical strength into account. In the case of the silicon dioxide, the layer is deposited by 200 nm.

Figure 9D:
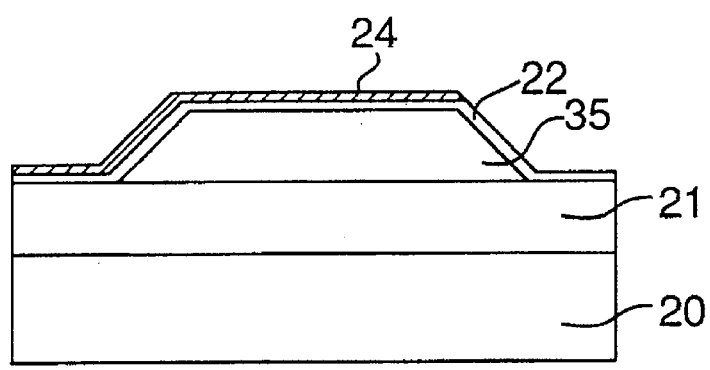

Next, as shown in FIG. 9D, a layer made of metal or titanium nitride is formed on the insulator layer 22 with reactive sputtering, and the layer is patterned to form an electrode 24.

Figure 9E:
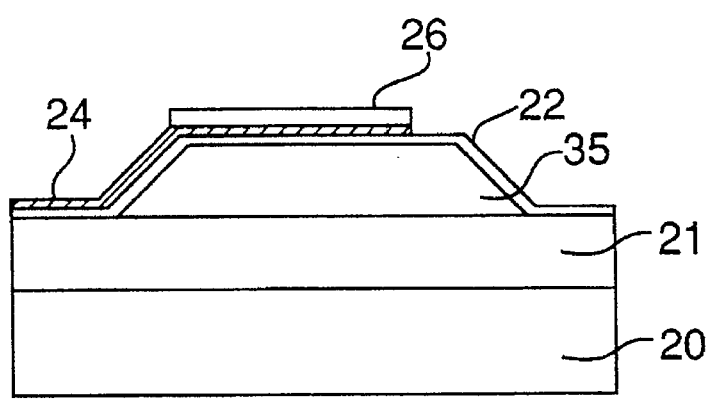

Next, as shown in FIG. 9E, a semiconductor layer 26 made of polycrystalline or amorphous silicon is formed thereon.

Figure 9F:
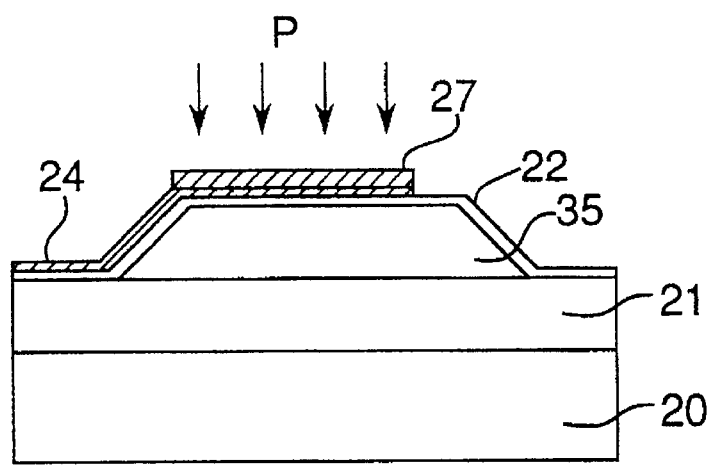

Next, as shown in FIG. 9F, ion implantation of impurity element such as phosphor at a high concentration is performed to form a high concentration impurity semiconductor layer 27.

Figure 9G:
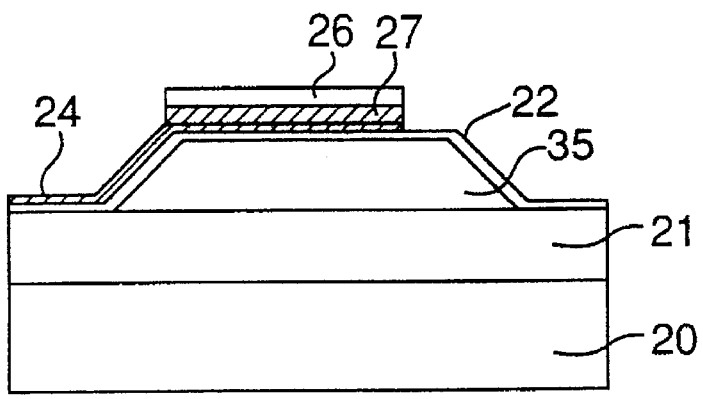

Next, as shown in FIG. 9G, a semiconductor layer 26 made of polycrystalline or amorphous silicon is formed on the electrode 24.

At this time, the semiconductor layer 26 may be implanted with impurities of phosphor or the like of a low concentration to realize a desired temperature coefficient of resistance (TCR) or without no impurity implantation.

Figure 9H:
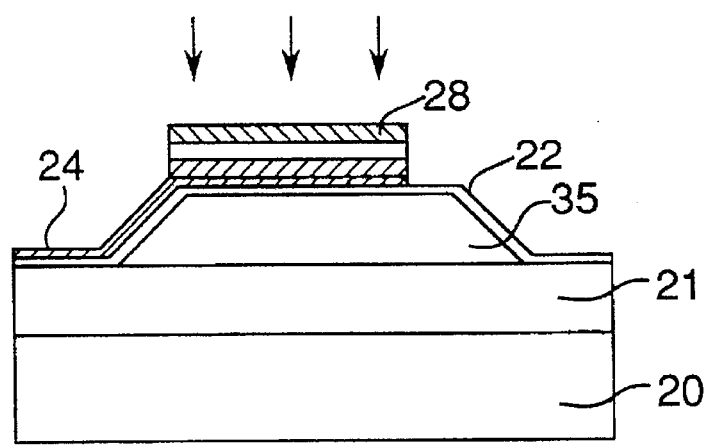

Next, as shown in FIG. 9H, a polycrystalline or amorphous silicon layer if formed on the layer 26, and ion implantation of impurity element such as phosphor of a high concentration is performed on the silicon layer to form a high concentration impurity layer 28.

The phosphor of a high concentration is implanted into the high concentration impurity layers 27 and 28 to realize specific resistivity of $10^{-2}$ Ω·m or less.

Phosphor is used as impurity element in this embodiment for the high concentration impurity layers 27 and 28. However, arsenic, boron or the like may also be used instead of phosphor.

When the semiconductor layer 26 as a various polycrystalline or amorphous silicon layer is formed with plasma CVD or reduced pressure CVD by using a material of silane, phosphine or the like, a laminated film may be formed simultaneously as continuous processes for forming the high concentration impurity layers 27, 28 and the semiconductor layer 26 as a low concentration impurity layer or the like.

Further, as an alternative, each ion implantation is performed, and each impurity atoms may be diffused from the silicon dioxide layer including phosphor of a high concentration.

Figure 9I:
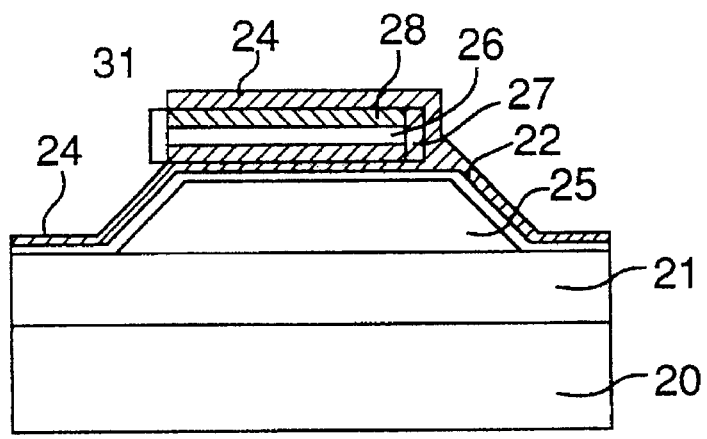

Next, as shown in FIG. 9I, after an insulator layer 31 is formed, an electrode 24 is formed on the heat-sensitive semiconductor layer comprising the semiconductor layer 26 and the high concentration impurity layers 27 and 28.

Next, though not shown, a hole is formed from the insulator layer 22 as an outer side of the pattern of the heat-sensitive semiconductor layer to the sacrificing layer 35. Then, a solution of potassium hydroxide, hydrazine or the like is implanted into the hole to solve the sacrificing pattern 35 so as to form a cavity 25.

EMBODIMENT 4

Figure 10A:
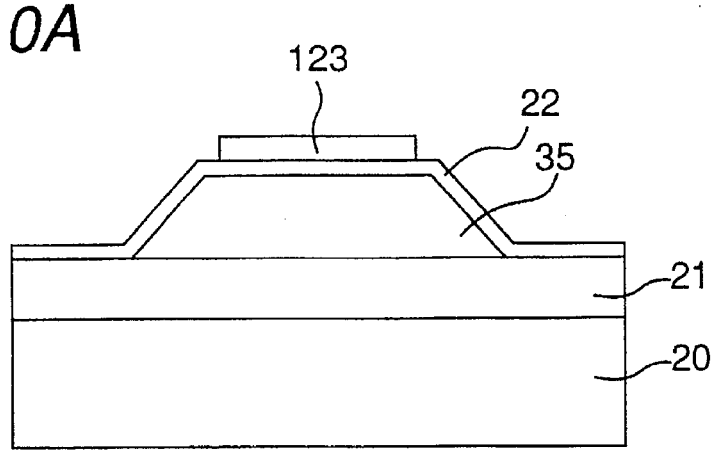
FIGS. 10A–10C are schematic sectional views for illustrating manufacturing steps of the infrared sensor of the second embodiment of the invention.
Figure 10B:
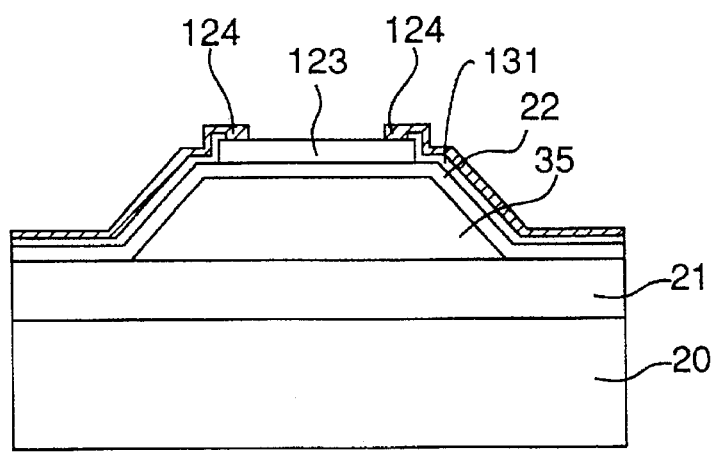
Figure 10C:
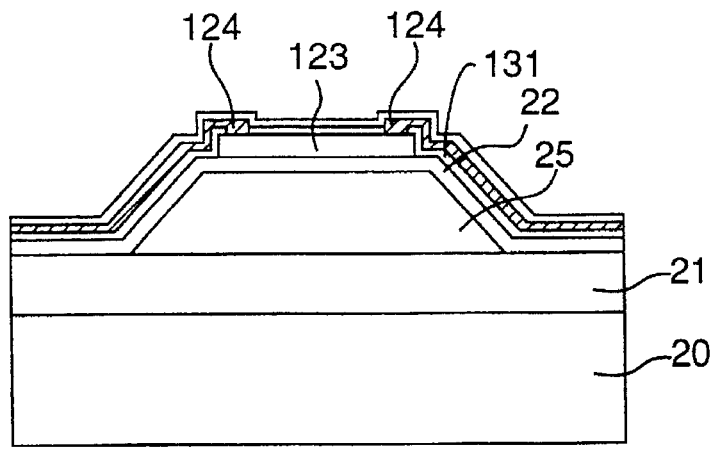

FIGS. 10A–10C shows steps in a manufacturing method of the infrared sensor shown in FIGS. 5A and 5B wherein the current flows in the heat-sensitive semiconductor layer 123 in parallel to the plane of the silicon substrate 20. As shown in FIG. 10A, after the insulator layer 22 is formed on the sacrificing layer 35 as shown in FIG. 9C in the third embodiment, a heat-sensitive semiconductor layer 123 is formed according to processes explained later.

Next, as shown in FIG. 10B, after an insulator layer 131 is formed, an electrode 124 is formed adjacent to the heat-sensitive semiconductor layer 123.

Next, as shown in FIG. 10C, the sacrificing layer 35 is dissolved to form a cavity 25, similarly to the process in the third embodiment.

Figure 11:
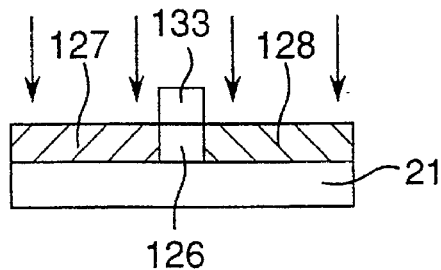
FIG. 11 is a diagram for illustrating manufacturing steps of an infrared detection part.

FIG. 11 shows a process for controlling the width of the semiconductor region 126 of the infrared sensor. On an insulator layer 21 made of silicon dioxide or the like formed above the silicon substrate 20 (not shown), a semiconductor layer 26 made of polycrystalline or amorphous silicon is formed. Next, an organic resist mask 133 having a desired shape is formed, and ion implantation of phosphor, boron or the like is performed by using the mask, to form the high concentration impurity regions 127 and 128 with ion implantation of the same kind of ions.

The precision of the width of the semiconductor region 126 is determined according to the precision of a reticle made for a photolithography process. By removing the organic resist mask 133 and the remained silicon dioxide layer, a bolometer having the heat-sensitive semiconductor layer 123 is completed.

FIGS. 12A–12D show processes of a manufacturing method for forming the high concentration impurity regions 127 and 128 by using ion implantation of different kinds of ions at both sides of the semiconductor region 126.

Figure 12A:
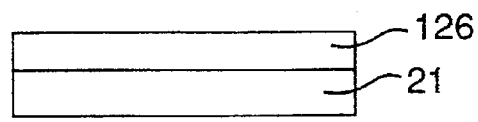
FIGS. 12A–12D are schematic sectional views for illustrating other manufacturing steps of the infrared detection part.

As shown in FIG. 12A, first, a semiconductor region 126 as a polycrystalline or amorphous silicon is formed on an insulator layer 21 made of silicon dioxide formed on a silicon substrate 20 (not shown).

Figure 12B:
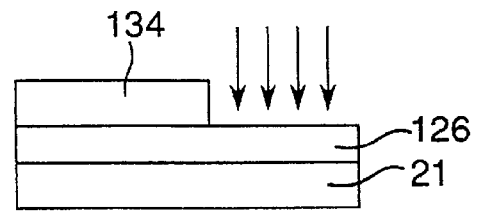

Next, as shown in FIG. 12B, a first organic resist mask 134 is formed on the semiconductor region 126, and impurity ions of a first high concentration is implanted by using the mask, to form a first high concentration impurity region 128. Then, the first organic resist mask 134 is removed with etching.

Figure 12C:
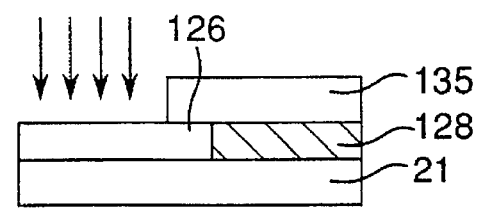
Figure 12D:
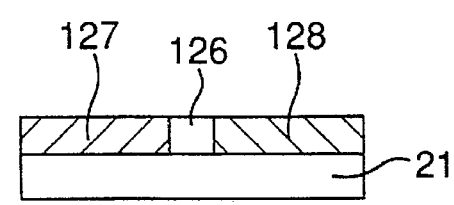

Next, as shown in FIG. 12C, a second organic resist mask 135 is formed on the semiconductor region 126 and the first high concentration impurity region 128, and impurity ions of a second high concentration is implanted by using the mask. Then, the second organic resist mask 135 is removed with etching, to form a second high concentration impurity region 127.

In the method, a pattern formed by aligning the first organic resist mask 134 with respect to a first mark (not shown) has a first error due to the alignment. Then, the first mask vanishes on etching, the second organic resist mask 135 is also formed by aligning it with respect to the first mark, to form a second error. Therefore, an error of the pattern distance due to the first and second masks have a relative relation only through a first mark, so that it is a sum of the first and second errors, and it may become large.

FIGS. 13A–13F show another example wherein different kinds of ions are implanted at both sides of the semiconductor region 126 to form the high concentration impurity regions 127 and 128.

Figure 13A:
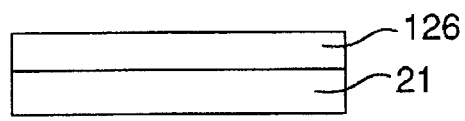
FIGS. 13A–13F are schematic sectional views for illustrating steps for manufacturing the infrared detection part.

As shown in FIG. 13A, a semiconductor region 126 made of polycrystalline or amorphous silicon is formed on an insulator layer 21 made of silicon dioxide or the like formed first above a silicon substrate (not shown).

Figure 13B:
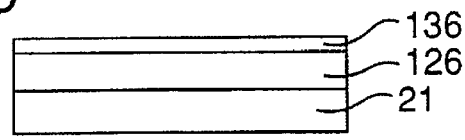

Next, as shown in FIG. 13B, a silicon dioxide layer 136 is formed on the semiconductor layer 126 with oxidation, CVD or the like.

Figure 13C:
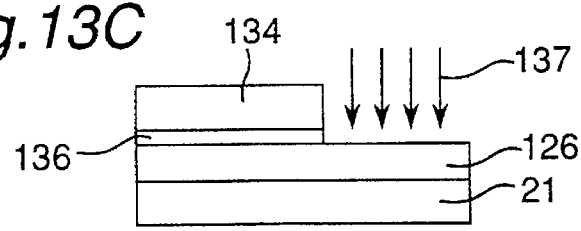

Next, as shown in FIG. 13C, an organic resist layer is formed thereon, and it is patterned to have a desired shape, to form a first organic resist pattern 134.

Next, a part of the silicon dioxide layer 136 is removed by using the pattern 134 as a mask.

Then, impurities 137 of phosphor or the like of a high concentration is implanted by using the mask 134 to form a first high concentration impurity region 128.

Figure 13D:
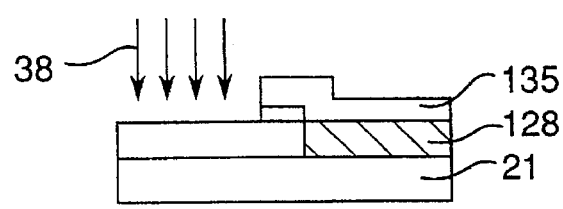

Next, as shown in FIG. 13D, after the first organic resist pattern 134 is removed, a second organic resist layer is formed thereon, and it is patterned to form a second organic resist pattern 134. Then, by using the pattern 134 as a mask, a part of the silicon dioxide layer 136 is removed.

Then, a second high concentration impurity region 127 is formed by second ion implantation of impurities 138.

Figure 13E:
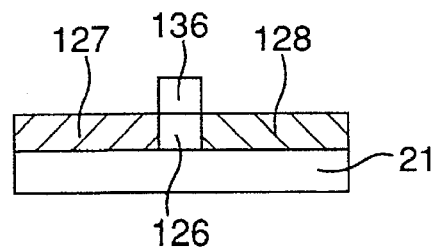
Figure 13F:
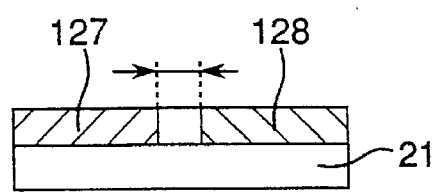

Next, as shown in FIG. 13E, the second organic resist mask 135 is removed, and as shown in FIG. 13F, the remained silicon dioxide layer 136 is removed to complete a heat-sensitive bolometer.

In the photolithography processes used in the above-mentioned method, first, the first organic resist mask 134 shown in FIG. 13C can be aligned in correspondence to the first mark (not shown) to form the first high concentration impurity region 128. Then, after the first organic resist mask 134 is removed, an edge portion of the silicon dioxide layer at a border line of the first high concentration impurity region 128 remains. However, the second organic resist mask is formed by using the edge portion as a second mask. Therefore, the width of the heat-sensitive semiconductor region 126 can be formed precisely.

Further, as shown in FIG. 2C, the infrared sensor of the invention may include diffusion prevention layers or barrier layers 30 between the semiconductor layer 26 made of the polycrystalline or amorphous silicon layer 26 and the high concentration impurity layers 27, 28 in the heat-sensitive semiconductor layer 23. The barrier layer 30 is provided in order to prevent diffusion of phosphor or the like from the high concentration impurity layers 27, 28 to the semiconductor layer 26 as a low concentration impurity layer, in high temperature processes included in the manufacturing method of an integrated circuit or the like formed at the same time as the infrared sensor. Similarly, in the sensor of the second embodiment, the diffusion prevention layers or barrier layers may also be provided between the semiconductor region 126 and the high concentration impurity regions 127, 128 in the heat-sensitive semiconductor layer 123.

For example, in the infrared sensor of the first embodiment, after the high concentration impurity layer 27 shown in FIG. 9F is formed, its surface is oxidized or nitridized, to form a barrier layer 30 of a thickness of a few nanometers. As an example of nitriding, ECR plasma process or a lamp annealing in nitrogen environment is performed. Then, a semiconductor layer 26 is formed, and its surface is oxidized or nitridized, to form a barrier layer 30 of a thickness of a few nanometers. Then, the flow of the method returns to the processes of the third embodiment.

As explained above the diffusion prevention layers 30 are provided between the semiconductor layer and the high concentration impurity layers. Because diffusion of impurities at high temperature can be prevented, the performance of the sensor does not change after manufacturing processes at high temperature.

It has been confirmed that the barrier layer 30 does not hinder the movement of carriers, but suppresses diffusion of impurity element (e.g. International Conference of Solid State Device and Material 1994, p422).

These processes can be carried out in an ordinary integrated circuit apparatus easily. The surface of the semiconductor layer 26 is also subjected to the same treatment.

Next, an example of a manufacturing method is explained of forming the electrode 24 after the formation of the heat-sensitive semiconductor layer, as shown in FIG. 2B. In the manufacturing method of the third embodiment, a structure shown in FIG. 2B is produced first. Then, after the high concentration impurity layer 28 is formed, the electrode 24 is formed at the same time. Therefore, one process can be omitted.

As explained above, in a process for determining the width of the semiconductor layer, after the first resist mask is removed, the second resist mask is formed by using the remained insulator layer as a reference position. Therefore, alignment of both sides of the width can be performed by using the same reference position. Thus, by using the manufacturing method, scattering of performance of sensors between lots is small and the precision thereof is higher.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. An infrared sensor comprising:
   a substrate;
   an insulator layer formed on said substrate;
   a first electrode formed on said insulator layer;
   a heat-sensitive semiconductor section including a first high concentration impurity semiconductor layer formed on said first electrode, a heat-sensitive semiconductor layer formed on said first high concentration impurity layer and having an electrical resistance depending on temperature, and a second high concentration impurity semiconductor layer formed on said heat-sensitive semiconductor layer, said first and second high concentration impurity semiconductor layers having a higher absorption coefficient of infrared rays than said heat-sensitive semiconductor layer; and
   a second electrode formed on the second high-concentration impurity semiconductor layer;
   wherein said first and second impurity semiconductor layers are formed on the top and bottom entire surfaces of said heat-sensitive semiconductor layer.

2. The sensor according to claim 1, wherein said first and second electrodes extend on entire planes of said heat-sensitive semiconductor section.

3. The sensor according to claim 1, wherein said heat-sensitive semiconductor layer between said first and second high concentration impurity semiconductor layers extends in a plane in parallel to a plane of said substrate.

4. The sensor according to claim 3, wherein a cavity is formed below said insulator layer, and a part of the insulator layer provides the plane in parallel to the plane of said substrate.

5. The sensor according to claim 3, wherein said heat-sensitive semiconductor section further includes a diffusion prevention layer between said heat-sensitive semiconductor layer and one of said high concentration impurity semiconductor layers.

6. The sensor according to claim 1, wherein said high concentration impurity semiconductor layers in said heat-sensitive semiconductor section have conduction types different from each other.

7. The sensor according to claim 1, wherein each said high concentration impurity semiconductor layer makes ohmic contact with a respective electrode.

8. The sensor according to claim 1, wherein said heat-sensitive semiconductor section further includes a diffusion prevention layer between said heat-sensitive semiconductor layer and one of said high concentration impurity layers.

9. An infrared sensor comprising:
   a substrate;
   an insulator layer formed on said substrate;
   a heat-sensitive semiconductor layer including a heat-sensitive semiconductor region having an electrical resistance depending on temperature, and high concentration impurity, semiconductor regions on opposite sides of the heat-sensitive semiconductor region, said heat-sensitive semiconductor region and said high concentration impurity semiconductor regions being formed on said insulator layer, said high concentration impurity semiconductor regions having a higher coefficient of absorption of infrared rays than said heat-sensitive semiconductor region; and
   electrodes connected to said high-concentration impurity semiconductor regions.

10. The sensor according to claim 9, wherein said heat-sensitive semiconductor layer extends in a plane in parallel to a plane of said substrate.

11. The sensor according to claim 10, wherein a cavity is formed below said insulator layer, and a part of the insulator layer provides the plane in parallel to the plane of said substrate.

12. The sensor according to claim 9, wherein said high concentration impurity semiconductor regions in said heat-sensitive semiconductor layer have conduction types different from each other.

13. The sensor according to claim 9, wherein each high concentration impurity semiconductor region makes ohmic contact with a respective electrode.

14. The sensor according to claim 9, further comprising a diffusion prevention region between said heat-sensitive semiconductor region and one of said high concentration impurity semiconductor regions.

15. An image sensor comprising:

a plurality of infrared sensors arranged as a matrix array, each infrared sensor having an infrared detection part including a semiconductor layer having an electrical resistance depending on temperature and two high concentration impurity semiconductor regions on opposite sides of said semiconductor layer, and two electrodes connected to the two high concentration impurity semiconductor regions, said two high concentration impurity semiconductor regions having a higher coefficient of absorption of infrared rays than said semiconductor layer;

scanning lines arranged along vertical and horizontal directions, two scanning lines at each intersection being connected to the two electrodes of one of the infrared sensors;

a first circuit for selecting a scanning line along vertical direction; and a second circuit for selecting a scanning line along horizontal direction;

wherein said high concentration impurity semiconductor regions in each sensor have conduction types different from each other.

16. The image sensor according to claim 15, wherein each high concentration impurity semiconductor region makes ohmic contact with a respective electrode to which it is connected.

* * * * *